United States Patent [19]

Strunk et al.

[11] Patent Number: 4,744,041
[45] Date of Patent: May 10, 1988

[54] METHOD FOR TESTING DC MOTORS

[75] Inventors: Timothy L. Strunk; Glenn S. Westerman, both of Lexington, Ky.

[73] Assignee: International Business Machines Corporation, Armonk, N.Y.

[21] Appl. No.: 707,709

[22] Filed: Mar. 4, 1985

[51] Int. Cl.$^4$ .................... G01P 3/42; G06F 15/332
[52] U.S. Cl. .................... 364/565; 318/245; 318/490; 324/177
[58] Field of Search ........... 364/487, 553, 576, 565; 318/490, 244–246; 324/177; 73/116, 117.2, 119 R

[56] References Cited

U.S. PATENT DOCUMENTS

| 3,675,126 | 7/1972 | Chilton | 324/177 |
|---|---|---|---|
| 4,067,060 | 1/1978 | Poussart et al. | 364/553 |
| 4,255,790 | 3/1981 | Hondeghem | 364/487 |
| 4,264,859 | 4/1981 | Blaess | 364/553 |
| 4,275,446 | 6/1981 | Blaess | 364/487 |
| 4,312,015 | 1/1982 | Montminy et al. | 364/553 |
| 4,527,101 | 7/1985 | Zavis et al. | 318/490 |
| 4,539,518 | 9/1985 | Kitayoshi | 364/576 |

FOREIGN PATENT DOCUMENTS

| 0079451 | 5/1983 | European Pat. Off. |  |
| 59-56170 | 3/1984 | Japan | 364/553 |

OTHER PUBLICATIONS

Lord et al, "Pasek's Technique for Determining the Parameters of High Performance DC Motors", May 1974, pp. 1–10.
Poussart et al, "Rapid Measurement of System Kinetics-An Instrument for Real-Time Transfer Function Analysis", Proceedings of the IEEE, vol. 65, No. 5, pp. 741–747, May, 1977.
"A Frequency Response Method for Determining the Parameters of High-Performance DC Motors" by R. A. Schulz, IEEE Transactions on Industrial Electronics, vol. 1E-30, No. 1, pp. 39–42, Feb. 1983.

Primary Examiner—Parshotam S. Lall
Assistant Examiner—Brian M. Mattson
Attorney, Agent, or Firm—William J. Dick; John A. Brady

[57] ABSTRACT

Disclosed is a DC parameter motor tester based on current time response, which tester does not require coupling of the motor (14) to some mechanical device or measuring other noise sensitive parameters taken from only a few discrete data points. As is disclosed, the steady state speed of the motor is determined from the frequency composition of the commutation noise and ripple in the steady state current by performing a fast fourier transform on the steady state current to determine its power-spectral-density which shows the frequency composition of the steady state current waveform by giving the power in the waveform at each frequency. The frequency at which the most power exists is divided by the number or twice the number, depending upon the construction of the motor, of commutation segments in the motor to determine the motor's frequency of rotation or velocity at measured power input. The parameters which are derived from the current time response points are taken from data in which such data has a significant, if not dominant influence.

10 Claims, 6 Drawing Sheets

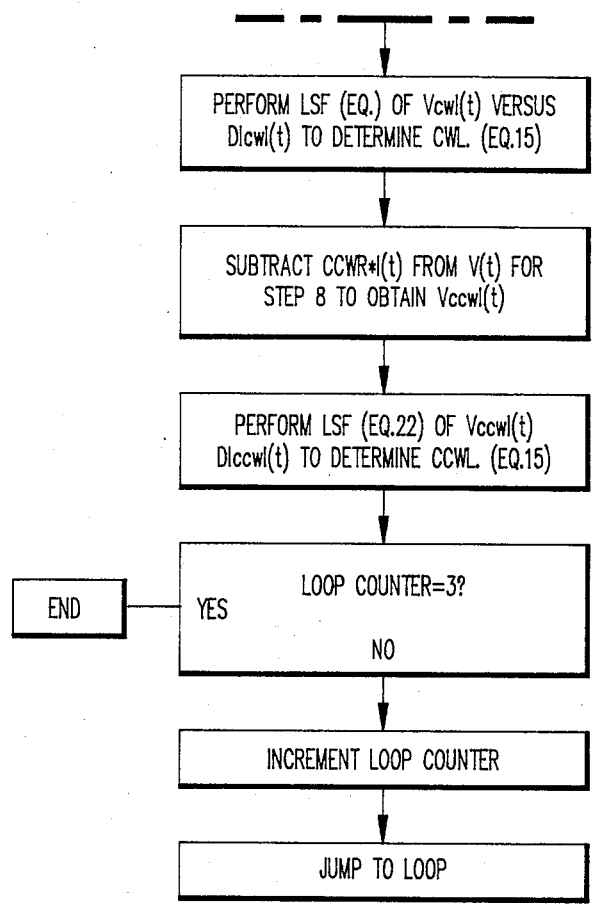

METHOD FOR TESTING DC MOTORS

FIELD OF THE INVENTION

The present invention relates to methods and apparatus for testing a Direct Current (DC) motor whether commutated mechanically or electrically (brush and brushless, respectively) base upon current-time response, and more particularly a DC motor parameter tester which does not require coupling the motor to some mechanical device, or measuring other noise sensitive parameters taken from only a few discrete data points. The present invention determines steady-state speed from the frequency composition of the commutation noise and ripple in the steady state current. The parameters which are derived from current-time response points are taken from data in which the parameter has a significant if not dominant influence.

BACKGROUND OF THE INVENTION

Conventional DC motor testers include speed-torque-current testers in which data is collected to form a set of constant points on the speed-torque-current operating curves. No time dependent data is collected. This type of tester requires that the motor be coupled to a velocity and a torque measuring system as well as a current measuring system.

The following publication describes a technique known in the prior art as "Pasek's Dynamic Method" of motor testing: W. Lord and J. W. Hwang, "Pasek's Technique for Determining the Parameters of High-Performance DC Motors", Proceedings of the Third Annual Symposium on Incremental Motion Control Systems and Devices, University of Illinois, pp. R.1–10, May 1974.

The "Pasek Dynamic Method" of motor testing is based on the starting current, peak current, peak current time of occurrence, current at twice the time of the peak current occurrence, steady state current and steady state velocity. Pasek's method measures a few specific points on the current time response curve making it very sensitive to current commutation noise, which renders the method inaccurate for low-cost DC motors of the type which would be commonly employed in printers and the like. Pasek's method is in fact only useable on special high quality servo motors. Because of the noise sensitivity problem, it is unknown whether there are any manufacturers who in fact employ a tester based upon this method. In the instance of the present invention, the motor is not coupled to a tachometer or encoder, and the parameters are calculated from more than a few data points and are calculated only from data in which a significant influence is recognized.

Certain of the prior art discusses the utilization of current spikes to measure the speed of a commutated electric motor. For example, U.S. Pat. No. 3,675,126 which issued on July 4, 1972, discloses a current transfer and a band pass filter for sensing power line perturbations caused by motor commutation. The sense perturbations trigger a one shot multivibrator, the on time of which, with respect to total time is taken as a measure of motor speed. Moreover, in U.S. Pat. No. 3,079,523 a speed regulating system for direct current commutating motors is described in which the frequency of commutation is recognized as being proportional to the motor speed. However, none of these patents or any other references disclose the idea of performing a Fourier transform on the steady state current to determine its power-spectral-density, and therefore, the frequency at which maximum power is developed by the commutation.

SUMMARY OF THE INVENTION

In general, the tester operates as follows: a voltage test waveform is generated by, for example, an IBM Personal Computer (P.C.). A power amplifier amplifies the voltage test waveform and applies it to the motor while the current through the motor being tested is sensed by a current sensor. The IBM Personal Computer samples and stores the measured current and voltage values at a plurality of discrete time intervals, and then calculates all of the motor's electrical parameters. When calculating the motor's electrical parameters, the P.C. performs a fast Fourier transform on the steady state current to determine its power-spectral-density which shows the frequency composition of the steady state current waveform by giving the power in the waveform at each frequency. The frequency at which the most power exists is divided by the number or twice the number, depending upon the motor's construction, of commutation segments in the motor to determine the motor's frequency of rotation or velocity.

The six parameters which are calculated by the DC motor tester of the present invention are important as a collective whole because these parameters, along with the motor's inertia, completely describe the response of an unloaded DC motor to a voltage waveform. Knowing the load conditions, the motor's inertia and the thermal resistance of the motor from other sources, along with the parameters from the tester, permits the complete calculation of a motor's performance for any given application.

The motor tester of the present invention characterizes a motor in terms of its Resistance (R), Torque Constant (Kt), Back-EMF Constant (Ke), Inductance (L), Constant Friction (Tf) and Damping or Viscous Friction (B).

The advantages of the tester of the present invention over conventional speed torque current testers are, (1) the dynamic tester does not need to be mechanically coupled to the motor under test; (2) the tester of the present invention has a bidirectional test time of two seconds with a calculation of parameters and loading time of approximately four to five seconds as opposed to the several minutes required from a conventional tester, and; (3) the cost of such a system is relatively minor since the hardware comprises only a microprocessor based digital computer (in the example an IBM Personal Computer) including a data acquisition board, a power amplifier, and a current probe or the like.

Accordingly, as shall be shown, the dynamic tester of the present invention is ideal for the automated testing of DC motors. Moreover, because of its simplicity, it is also ideal for laboratory use since the motor is characterized while it is being dynamically tested, i.e., when the motor is accelerating and decelerating. Moreover, motor parameter values found from the motor's dynamic response predict the motor's behavior in a dynamic condition better than parameter values from steady-state speed-torque-current testers. In addition, it is possible to characterize the motor while it is installed and working in the particular application desired.

Other advantages of the present invention may be seen with reference to the following specification and claims taken in conjunction with the accompanying drawings.

BRIEF DESCRIPTION OF THE DRAWINGS

FIGS. 3A–3E are a program flowchart illustrating the steps of a simple program for determining the parameters of the motor by use of the Personal Computer.

DETAILED DESCRIPTION OF THE INVENTION

Figure 1:
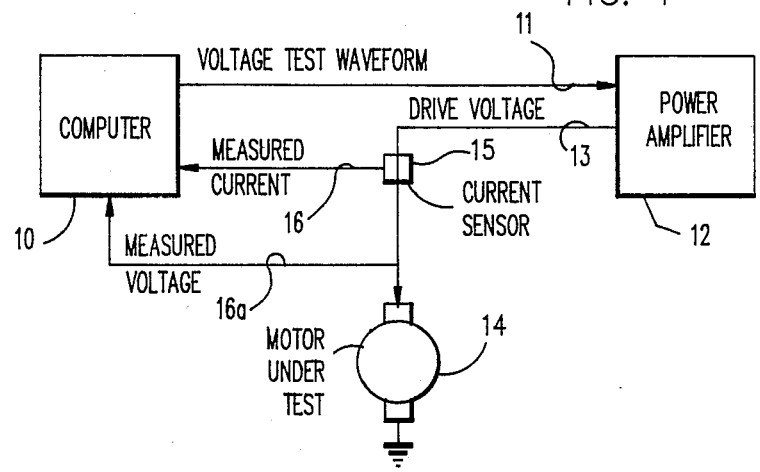
FIG. 1 is a schematic layout of a motor tester set up in accordance with the present.

Referring now to the drawing, and especially FIG. 1 thereof, a Personal Computer 10, such as an IBM Personal Computer is shown connected by way of line 11 to a power amplifier 12. The power amplifier in turn has an output along line 13 to apply a voltage waveform to a DC motor 14 under test. A current sensor or current probe 15 provides an output of measured current back to the computer 10 for collecting as through line 16 the measured current values and as through line 16a, the measured voltage values. A suitable digital to analog converter board for the P.C. may include the DT2818 Data Acquisition Board made by Data Translation, Inc.; 100 Locke Drive; Marlborough Mass. 01752. The board is both a D/A and A/D convertor which operates simultaneously on all channels. It also has the convenience (for providing increased operating speed) of direct memory access which operates well with the IBM PC which has direct memory access capability. All input channels also have simultaneous sample and hold capabilities. (Of course, the single board may be replaced with a pair of boards, one serving as an output and the other serving as an input for data acquisition.)

The motors being tested may be of any DC type, for example a model 9414 manufactured by Pittman Motor Co., or a Buehler Products 13.35, or a Johnson Electric Ltd. HC615XL. It should be recognized, however, that this list is not to be considered the only motors capable of being tested using the method and apparatus of the present invention, the listing only being representative.

GENERAL OPERATION

Figure 2A:
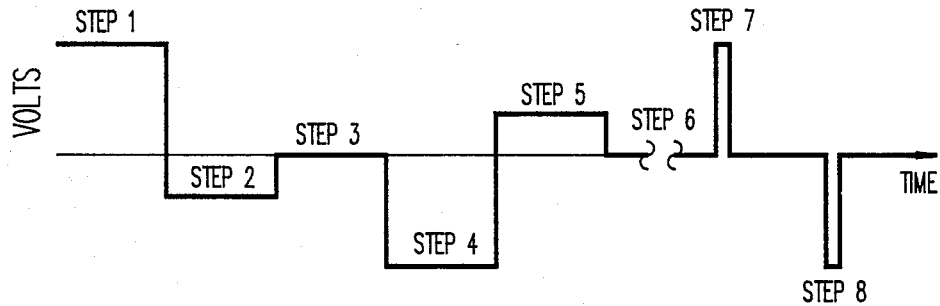
FIG. 2A is a voltage test waveform with reference to time which is applied by the tester to the motor under test.

The tester operates by applying a voltage test waveform of known type thereto, which waveform is generated for example by the Personal Computer 10. The power amplifier 12 which may be of a laboratory type of sufficient output power capability, serves to drive the motor. A current sensor which may either be a series resistor to motor 14, or a current probe, measures the current into the motor 14 and sends the sample current as data to the P.C. The P.C. samples and stores the measured instantaneous current value at many discrete times and then calculates the electrical parameters of the motor 14. When calculating the parameters, the compter operates under the direction of the program which has been flowcharted in FIG. 3, performing a fast Fourier transform on the steady state current to determine its power-spectral-density (PSD). The power-spectral-density illustrates the frequency composition of the steady state current waveform by giving the power in the waveform at each frequency. The frequency at which the most power exists is divided by the number or twice the number, depending upon the motor's construction, of commutation segments in the motor to determine the motor's frequency of rotation or velocity. This is true of either a brush or brushless DC motor. For the case of a brushless DC motor with a speed output, the steady-state speed may be determined from the electronically switched output and the fast-Fourier transform of the steady-state current would not need to be performed to determine steady-state speed. If a speed output is not provided on the brushless DC motor under test, then the steady-state speed can be determined from the steady-state current as mentioned before. A typical plot of the power versus power-spectral-density is illustrated in FIG. 2C, and will be explained more fully hereinafter.

Figure 2B:
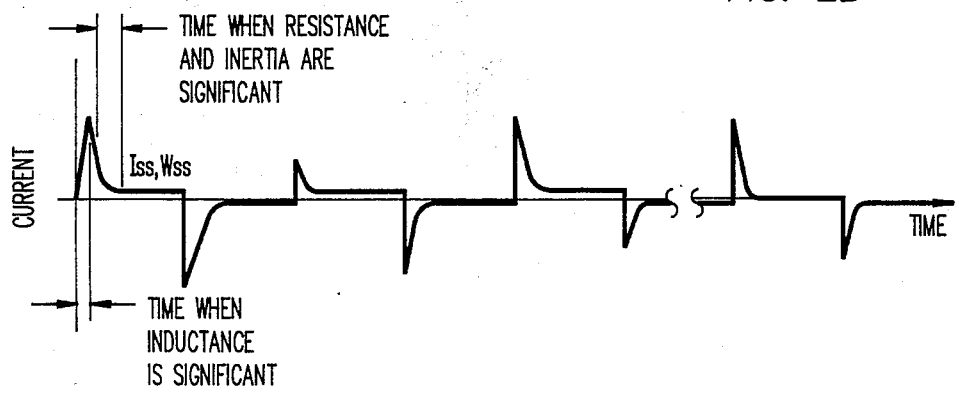
FIG. 2B is a current time response as sensed by a current sensor in conjunction with the motor being driven under test.
Figure 2C:
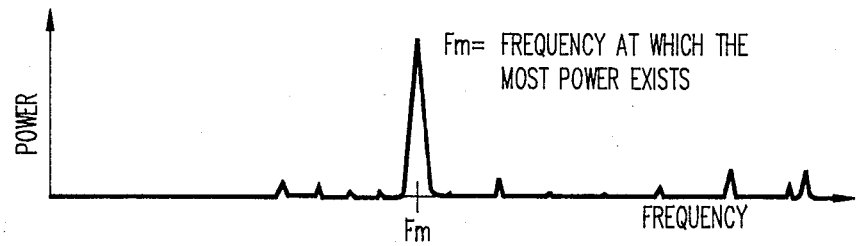
FIG. 2C is a graphical representation of the power-spectral-density of the steady state current and illustrating the frequency at which maximum power exist.

The current time response waveform illustrated in FIG. 2B is divided into segments in which each parameter has dominant influence, as shown therein. Each parameter is found from a least-squares fit, allowing the influence of many points of the data from the segment in which it is significant.

DETAILED DESCRIPTION

The DC motor tester operating in accordance with the method of the present invention calculates the six parameters listed and defined in Table 1 below. These parameters are important because, along with the motor's inertia, completely describe the response of an unloaded DC motor to a voltage waveform. Knowing the load conditions, the motor's inertia and the thermal resistance of the motor from other sources*, along with the parameters from, for example, a step response tester permits the complete calculation of a motor's performance in an application.

*Note: Other sources include manufacturing data, test lab data or inertia, design load conditions, etc.

TABLE 1

| PARAMETER | DEFINITION | WHY IMPORTANT |
| --- | --- | --- |
| $K_e$ | Back-EMF Constant | Dominate factor in determining motor's steady-state speed for a given voltage |
| $K_t$ | Torque Constant | Determines motor's required current for a given torque output |
| R | Terminal Resistance | Determines how much power will be dissipated in the motor for a given current level |
| L | Armature Inductance | Determines how fast current to the motor can be turned on |
| $T_f$ | Constant Friction | The internal torque load to the motor which is independent of speed |
| B | Viscous (Damping) Friction | The factor that is multiplied by speed to determine the internal torque |

TABLE 1-continued

| PARAMETER | DEFINITION | WHY IMPORTANT |
|---|---|---|
| | | load that is proportional to speed |

ASSUMPTIONS AND DEFINITIONS OF TERMS

The tester of the present invention assumes that the motor being tested is a linear device and is therefore necessarily characterized by the following differential equations 1 and 2:

$$V(t) = R*I(t) + L*DI(t) + Ke*W(t) \qquad \text{Eq. 1}$$

$$Kt*I(t) = J*DW(t) + B*W(t) + Tf \qquad \text{Eq. 2}$$

(Note: Throughout this specification, the symbol "*" indicates multiplication.)

The symbols used in the above equations and throughout the specification are defined in Table 2 below:

TABLE 2

| SYMBOL | DEFINITION |
|---|---|
| V(t) | The voltage waveform applied to the motor |
| I(t) | The motor's resultant current waveform |
| W(t) | The motor's resultant velocity waveform |
| DI(t) | The derivative of the current waveform |
| DW(t) | The derivative of the velocity waveform |
| Iss(t) | The steady-state current waveform including ripple and noise |
| R | Terminal Resistance |
| L | Armature Inductance |
| Ke | Back-EMF Constant |
| Kt | Torque Constant |
| J | Rotor Inertia |
| B | Viscous Damping Friction |
| Tf | Constant Friction |
| Iss | Steady-State Current (Average of Iss(t)) |
| Wss | Steady-State Velocity |
| Fmax | Frequency with maximum power in PSD of Iss |
| Ncom | Number of commutator segments in motor |
| CW | Clockwise direction of rotation (positive velocity) |
| CCW | Counter-Clockwise direction of rotation (negative velocity) |

The operational philosophy of the tester is that the motor under test is operated by applying a voltage test waveform such as shown in FIG. 2A that consists of, in the illustrated instance, eight distinct steps, collecting the voltage and current waveforms, and then calculating the motor's parameters from the waveforms collected.

The voltage waveform, which is applied to the motor under test, exercises the motor in all four quadrants of its operating region. The quadrants are defined in terms of the polarity of the motor's state variables, current and velocity. Quadrant 1 is equal to plus current (I), plus (clockwise) rotation or velocity (CW); Quadrant 2 equals plus velocity (CW) minus current (−I); Quadrant 3 equals minus current (−I), minus (counterclockwise) velocity (CCW) and; Quadrant 4 equals plus current, minus (counterclockwise) velocity (CCW).

The voltage applied, its duration, the rate the A/D convertor samples the data, and the quadrant for the eight steps are set forth below in Table 3:

TABLE 3

| STEP | VOLTAGE | DURATION | SAMPLE RATE | QUAD-RANT |
|---|---|---|---|---|
| 1 | +Rated | 250–500 ms | 200–500 us | 1 |
| 2 | −½ Rated | 250–500 ms | 200–500 us | 2, 3 |
| 3 | Zero | 250–500 ms | 200–500 us | 4 |
| 4 | −Rated | 250–500 ms | 200–500 us | 3 |
| 5 | +½ Rated | 250–500 ms | 200–500 us | 4, 1 |
| 6 | Zero | 250–500 ms | 200–500 us | 2 |
| 7 | +Rated | 2–5 ms | 20–100 us | 1 |
| 8 | −Rated | 2–5 ms | 20–100 us | 3 |

NOTES:
1 Rated = Recommended operating Voltage of Motor Under Test.
2 +Voltage is defined as the polarity which turns the motor under test in the CW direction.
3 Duration is the length of time the step is on.
4 Sample rate is the time interval between data samples taken by the A/D converter. Sampling begins with the beginning of step 1.
5 Quadrant is the dynamic region (DW(t) not zero) in which the motor under test is exercised. The quadrant is defined in terms of the polarity of the motors state variables, current and velocity. Quadrant 1 = +I, +W; Quadrant 2 = −I, +W; Quadrant 3 = −I, −W; Quadrant 4 = +I, −W As set forth above, the waveform in FIG. 2A is applied as operating power to the motor 14 and the resulting current and voltage waveforms are sampled and stored. These waveforms from a single cycle as shon in FIG. 2A contain all of the information required to determine the motor's parameter values. The algorithms or equations employed to calculate the parameters values incorporates the following philosophy:

1. Each motor parameter must be calculated from the portions of the waveforms in which it has significant if not dominate influence. As an example, the armature inductance L is calculated only from the time periods in which the DI(t) term is significant. This is illustrated best in FIG. 2B in the first part of the waveform in which inductance is indicated as significant during a rapidly changing current.
2. The parameter values must be calculated in such a way as to minimize their sensitivity to the commutation disturbance in the current waveform. This is accomplished by two procedures:
   a. Calculation of parameter values is based upon many data points, not just a few special points;
   b. The waveforms are manipulated in such a way that the parameter values can be found from a least-squares fit of one waveform versus another, which tends to average out the commutation disturbances.
3. Where possible, the values of terminal resistance R and the torque constant Kt are calculated from all four quadrants of the operating region as defined above. For example, clockwise terminal resistance R (CW R) is calculated from the plus velocity, plus current quadrant and the plus velocity, minus current quadrant. Alternatively, counterclockwise (CCW) terminal resistance (CCW R) is calculated from the minus velocity, minus current quadrant and the minus velocity, plus current quadrant. In this manner, between clockwise (CW) terminal resistance R and counterclockwise (CCW) terminal resistance R, all four quadrants are represented.

The tester of the present invention is able to test a DC motor without it being coupled to a tachometer, load cell or a torque transducer for several reasons. The velocity waveform, for example, can be determined from the current waveform. Therefore, a tachometer is not required. Velocity determination from current is discussed in detail below. In the illustrated instance, the inertia of the motor is used as the load for the motor during test. When a voltage step is applied to the motor, such as shown in FIG. 2A, the current required to overcome inertia decays from almost stall current to steady state current Iss. Since a wide range of currents is provided by the inertia, a load cell is not required. If the inertia of the motor is known, the "load torque" is simply the inertia times the derivative of the velocity waveform DW(t) and the torque constant Kt can be determined. If the inertia is not known, then the torque constant cannot be explicitly determined but must be expressed as the ratio of torque constant versus rotor inertia. Alternatively, the torque constant Kt may be assumed equal to the back-EMF constant Ke. However, rotor inertia can be easily determined for a group of motor types with an independent test and, with reasonable accuracy, assumed to be same for all motors within that group. Therefore a torque transducer is not required to measure the load.

DETERMINING VELOCITY FROM CURRENT

The motor's steady state velocity or speed Wss can be determined from the steady-state current waveform including ripple and noise Iss(t) and more particularly from the power-spectral-density of the steady state current Iss(t). Inasmuch as a current spike occurs every time a commutator segment breaks contact with a brush and brushers are displaced conventionally so that one brush is in the center of a segment while the corresponding brush is at the edge of a segment, the number of current spikes per revolution is equal to twice the number of commutator segments. (In a brushless motor, the switching occurs electronically and therefor commutation can be easily evaluated in the same manner as a function of the number of switching operations.) Accordingly, when a power-spectral-density of the steady state current Iss(t) is examined, it is seen that Iss(t) is composed of two dominant frequencies; the direct current component and the frequency that contains velocity information. After a power-spectral-density measurement of the steady state current waveform Iss(t) is performed and the frequency at which the maximum power exists is found, the frequency with the maximum power in the power-spectral-density of the steady state current is designated (Fmax). After Fmax is found, the steady state velocity Wss can be calculated from Equation 3 given below.

$$Wss = 2\pi * Fmax/(2*Ncom) = \pi * Fmax/Ncom \qquad \text{Eq. 3}$$

Assuming a brush type DC motor, it is assumed that the number of commutator segments Ncom in the motor is known for a particular motor type. A typical power-spectral-density (PSD) is illustrated in FIG. 2C and illustrates the frequency at which the most power exists, which frequency is labeled Fmax.

The motor's resultant velocity waveform W(t) may be constructed from the current waveform I(t). Rearranging Equation 2 such as shown in Equation 4 below illustrates that the current waveform I(t) is composed of three parts: current related to the motor's inertia (J/Kt); current related to the motor's damping friction (B/Kt); and current related to the motor's constant friction (Tf/Kt).

$$I(T) = (J/Kt)*(DW(t)) + (B/Kt)*W(t) + Tf/Kt \qquad \text{Eq. 4}$$

If the viscous damping friction B divided by the torque constant Kt is temporarily assumed to be negligible as compared to the constant friction Tf divided by the torque constant Kt, then the current waveform becomes composed of only the rotor inertia J divided by the torque constant Kt and the constant friction Tf divided by torque constant Kt terms. Equation 4 then may be rewritten as Equation 5.

$$DW(t) = (I(t) - Tf/Kt)/(J/Kt) \qquad \text{Eq. 5}$$

Since, by definition, constant friction Tf divided by the torque constant Kt is the steady state current Iss, and since the rotor inertia J divided by the torque Kt is not known at this point, Equation 5 may be rewritten as Equation 6 as set forth below.

$$DW(t) = A*(I(t) - Iss) \qquad \text{Eq. 6}$$

Integrating both sides of Equation 6 gives Equation 7 below.

$$W(t) = A*\text{INTEGRAL}(I(t) - Iss) \qquad \text{Eq. 7}$$

Since steady state velocity Wss is known, "A" is simply the value required so that the steady state of the righthand side of Equation 7 equals the steady state velocity Wss. If the viscous damping friction B divided by the torque constant Kt is indeed insignificant compared to the constant friction divided by the torque constant Kt, then the velocity waveform has been constructed. If viscous damping friction B divided by the torque constant is significant, then the motor's resultant velocity waveform W(t) resulting from this equation should be scaled by the viscous damping friction B divided by the torque constant Kt and included in Equation 5 so that a new Equation 5 can be written as follows:

$$DW(t) = [I(t) - Tf/Kt - B/Kt*W(t)]/(J/Kt) \qquad \text{Eq. 5'}$$

It will be recognized that integrating both sides of Equation 5' and scaling so that the steady state region is equal to the steady state velocity Wss, results in the velocity waveform.

When velocity is to be determined for several concatenated steps, the above procedure may be followed for each such step.

The actual calculations for the parameters of the motor are discussed below. Because the calculations for the counterclockwise (CCW) parameters are identical to the calculations for the clockwise (CW) parameters, only the clockwise (CW) parameters are discussed. As has been described heretofore, the voltage waveform illustrated in FIG. 2A is applied to the motor 14, the resultant voltage waveform as well as the current waveform illustrated in FIG. 2B is sampled and stored.

Therefore, the integral of I(t) is constructed from the current waveform as outlined above to construct the velocity waveform. Then the viscous damping friction B as divided by the torque constant Kt and the constant friction Tf as divided by the torque constant Kt is calculated by using the steady state form of Equation 2, (in which DW(t) is zero) and solving for two unknowns with the two equations as set forth in Equations 8 and 9 below.

$$B/Kt = (Iss1 - Iss5)/(Wss1 - Wss5) \qquad \text{Eq. 8}$$

$$Tf/Kt = Iss1 - B/Kt*Wss1 \qquad \text{Eq. 9}$$

Thereafter, the rotor inertia J divided by the torque constant Kt is calculated using the region of data where the derivative of the velocity waveform DW(t) is significant by performing a least-squares approximation or fit of observed data with respect to Equation 2 arranged so that it is set forth as in Equation 10 below.

$$Y = (J/Kt)*X \qquad \text{Eq 10}$$

where
$Y = I(t) - (B/Kt)*W(t) - Tf/Kt$, and $X = DW(t)$

Thereafter, the terminal resistance R may be approximated from the peak current of the first step (see FIG. 2A), Ipeak. The armature inductance L may then be approximated from the terminal resistance R as shown in Equation 11 and 12.

$$R = V1/Ipeak \qquad \text{Eq. 11}$$

$$L = R/1000 \qquad \text{Eq. 12}$$

The back EMF constant Ke may be calculated from the steady state version of Equation 1 (in which DI(t) is zero), as set forth in Equation 13 below.

$$Ke = (V1 - R*Iss1)/Wss1 \qquad \text{Eq. 13}$$

The terminal resistance R may then be calculated with the regions of data where the derivative of the velocity waveform DW(t) is significant (i.e., at high currents) by performing a least-squares fit of observed data with respect to Equation 1 arranged so that it is set forth as in Equation 14 below. (See FIG. 2B).

$$Y = R*X \qquad \text{Eq. 14}$$

where $Y = V(t) - Ke*W(t) - L*DI(t)$ $X = I(t)$

The armature inductance L may be calculated using the regions of data where the derivative of the current waveform DI(t) is significant by performing such a least-squares fit of Equation 1 arranged as Equation 15 below.

$$Y = L*X \qquad \text{Eq. 15}$$

where
$Y = V(t) - Ke*W(t) - R*I(t)$ $X = DI(t)$

It is helpful then if the last three steps, i.e., the calculation of the back EMF contant Ke, the calculation of the value of the terminal resistance R and the calculation of the value of the armature inductance L are repeated three more times using values obtained from the prior computations. Since the value for the back EMF constant Ke is insensitive to the terminal resistance R as in Equation 13, the use of the approximate value of the terminal resistance R for the first pass of the calcination of the back EMF constant Ke yields a reasonable value for the back EMF constant Ke. Similarly, the value of the terminal resistance R in Equation 14 is insensitive to the value of the armature inductance L so that the approximation of the armature inductance yields a reasonable value for the value of the terminal resistance R. After performing several loops, the parameters converge to an approximation of their correct values.

The tester is quite accurate as indicated by its repeatability. The tester showed an average standard deviation of parameter value as a percentage of the mean for a set of Buehler, Johnson and Pittman motors which were tested ten times each resulting in the following table of parameters and standard deviation as set forth in Table 4 below:

TABLE 4

| PARAMETER | STANDARD DEVIATION |
|---|---|
| Ke | 0.4% of Mean |
| Kt | 0.8% of Mean |
| R | 0.6% of Mean |
| L | 4.5% of Mean |
| B | 8.9% of Mean |
| Tf | 3.3% of Mean |

The values from the tester accurately simulates the motor's current and velocity response to an arbitary voltage waveform. The current and velocity responses are then simulated based on parameter values from the tester of the present invention, and then compared to the actual responses. The simulated responses match the actual responses quite well. Moreover, the values from the dynamic tester match those from a conventional speed torque current tester with the following average percent differences (Table 5) for a set of Buehler, Johnson and Pittman motors.

TABLE 5

| PARAMETER | PERCENT DIFFERENCE |
|---|---|
| Ke | 2.0% |
| Kt | 2.6% |
| R | 3.4% |

THE COMPUTER PROGRAM

The steps of the computer program by which the parameters identified heretofore may be quickly and easily calculated is shown in FIG. 3. The flowchart of FIG. 3 utilizes the symbols and definitions which are set forth in Table 6 below and which relate to those definitions and mnemonic symbols heretofore described.

TABLE 6

| SYMBOL | DEFINITION |
|---|---|
| CWR | CLOCK-WISE RESISTANCE |
| CWL | CLOCK-WISE INDUCTANCE |
| CWKe | CLOCK-WISE BACK-EMF |
| CWKt | CLOCK-WISE TORQUE CONSTANT |
| CWBKt | CLOCK-WISE DAMPING FRICTION/TORQUE CONSTANT |
| CWTfKt CLOCK-WISE | CONSTANT FRICTION/TORQUE CONSTANT |
| CWJKt | CLOCK-WISE INERTIA/TORQUE CONSTANT |
| CCWR | COUNTER CLOCK-WISE RESISTANCE |

TABLE 6-continued

| SYMBOL | DEFINITION |
|---|---|
| CCWL | COUNTER CLOCK-WISE INDUCTANCE |
| CCWKe | COUNTER CLOCK-WISE BACK-EMF |
| CCWKt | COUNTER CLOCK-WISE TORQUE CONSTANT |
| CCWBKt | COUNTER CLOCK-WISE DAMPING FRICTION/TORQUE CONSTANT |
| CCWTfKt | COUNTER CLOCK-WISE CONSTANT FRICTION/TORQUE CONSTANT |
| CCWJKt | COUNTER CLOCK-WISE INERTIA/TORQUE CONSTANT |
| V1 | 1st STEP VOLTAGE |
| V2 | 2nd STEP VOLTAGE |
| V3 | 3rd STEP VOLTAGE |
| V4 | 4th STEP VOLTAGE |
| V5 | 5th STEP VOLTAGE |
| V6 | 6th STEP VOLTAGE |
| V7 | 7th STEP VOLTAGE |
| V8 | 8th STEP VOLTAGE |
| Iss1 | 1st STEP STEADY-STATE AVERAGE CURRENT |
| Iss2 | 2nd STEP STEADY-STATE AVERAGE CURRENT |
| Iss4 | 4th STEP STEADY-STATE AVERAGE CURRENT |
| Iss5 | 5th STEP STEADY-STATE AVERAGE CURRENT |
| Ipeak | PEAK CURRENT FOR 1st STEP |
| Wss1 | 1st STEP STEADY-STATE SPEED |
| Wss2 | 2nd STEP STEADY-STATE SPEED |
| Wss4 | 4th STEP STEADY-STATE SPEED |
| Wss5 | 5th STEP STEADY-STATE SPEED |
| V(t) | VOLTAGE WAVEFORM |
| I(t) | CURRENT WAVEFORM |
| W(t) | VELOCITY WAVEFORM |
| DI(t) | CURRENT DERIVATIVE WAVEFORM |
| DW(t) | VELOCITY DERIVATIVE WAVEFORM |
| Iss1(t) | 1st STEP STEADY-STATE CURRENT WAVEFORM |
| Iss2(t) | 2nd STEP STEADY-STATE CURRENT WAVEFORM |
| Iss4(t) | 4th STEP STEADY-STATE CURRENT WAVEFORM |
| Iss5(t) | 5th STEP STEADY-STATE CURRENT WAVEFORM |
| DWcwj(t) | PORTION OF VELOCITY DERIVATIVE FROM WHICH CWJKt IS FOUND |
| DWccwj(t) | PORTION OF VELOCITY DERIVATIVE FROM WHICH CCWJKt IS FOUND |
| Vcwr(t) | PORTION OF VOLTAGE WAVEFORM FROM WHICH CWR IS FOUND |
| Vccwr(t) | PORTION OF VOLTAGE WAVEFORM FROM WHICH CCWR IS FOUND |
| Icwr(t) | PORTION OF CURRENT WAVEFORM FROM WHICH CWR IS FOUND |
| Iccwr(t) | PORTION OF CURRENT WAVEFORM FROM WHICH CCWR IS FOUND |
| Icwj(t) | PORTION OF CURRENT WAVEFORM FROM WHICH CWKj(t) IS FOUND |
| Iccwj(t) | PORTION OF CURRENT WAVEFORM FROM WHICH CCWKj(t) IS FOUND |
| Vcwl(t) | PORTION OF VOLTAGE WAVEFORM FROM WHICH CWL IS FOUND |
| Vccwl(5) | PORTION OF VOLTAGE WAVEFORM FROM WHICH CCWL IS FOUND |
| DIcwl(t) | PORTION OF CURRENT DERIVATIVE FROM WHICH CWL IS FOUND |
| DIccwl(t) | PORTION OF CURRENT DERIVATIVE FROM WHICH CCWL IS FOUND |
| FFT | FAST-FOURIER TRANSFORM |
| LSF | LEAST-SQUARES FIT |
| ABS | ABSOLUTE VALUE |

Prior to discussing the details of the flowchart illustrated in FIG. 3, since so much of the results of the motor test depend upon computing the fast-Fourier transform (FFT), it may be helpful to discuss how the fast-Fourier transform of two real functions simultaneously are resolved.

At the outset, it is desired to compute the discrete Fourier transform of the real time functions H(k) and G(k) from the complex function shown below in Equation 16.

$$y(k) = h(k) + jg(k) \qquad \text{Eq. 16}$$

$k=0, 1, \ldots, N-1$.

In Equation 16, y(k) is constructed to be the sum of two real functions where one of these real functions is taken to be imaginary. From the linearity property, the discrete fourier transform of y(k) is given by Equation 17.

$$\begin{aligned} Y(n) &= \sum_{k=0}^{N-1} y(k)\, e^{-j2\pi nk/N} \\ &= R(n) + jI(n) \quad n = 0,1,\ldots,N-1 \end{aligned} \qquad \text{Eq. 17}$$

Where R(n) and I(n) are the real and imaginary parts of Y(n).

In Equation 16, the complex function may be rewritten for the case in point, as in Equation 16a given below.

$$y(k) = Iss1(k) + jIss2(k) \qquad \text{Eq. 16a}$$

Thus, in Equation 17, N equals the number of points sampled.

The definitions of the variables employed in Equations 16, 16a and 17 as well as that for Equations 18 and 19 is defined in Table 7.

TABLE 7
Definitions of Variables

| | |
|---|---|
| y(k) = | COMBINED WAVEFORM OF Iss1(k) AND Iss2(k) |
| Y(n) = | FREQUENCY DOMAIN REPRESENTATION OF y(k) |
| R(n) = | REAL PORTION OF Y(n) |
| jI(n) = | IMAGINARY PORTION OF Y(n) |
| H(n) = | FREQUENCY DOMAIN REPRESENTATION OF Iss1(n) = HR(n) + HJ(N) |
| G(n) = | FREQUENCY DOMAIN REPRESENTATION OF Iss2(n) = GR(n) + GJ(n) |
| HM(n) = | MAGNITUDE VERSUS FREQUENCY FOR Iss1(n) |
| GM(n) = | MAGNITUDE VERSUS FREQUENCY FOR Iss2(n) |

Equations 18 and 19 compute the discrete transforms of H(k) and G(k) where the discrete transforms H(n) and G(n) are defined in Table 7 as the frequency domain representation of Iss1 and Iss2 respectively.

$$H(n) = \left[\frac{R(n)}{2} + \frac{R(N-n)}{2}\right] + j\left[\frac{I(n)}{2} - \frac{I(N-n)}{2}\right] \qquad \text{Eq. 18}$$

$$G(n) = \left[\frac{I(n)}{2} + \frac{I(N-n)}{2}\right] - j\left[\frac{R(n)}{2} - \frac{R(N-n)}{2}\right] \qquad \text{Eq. 19}$$

n = 0, 1, ... N−1.

After computing H(n) and G(n) where $$\begin{array}{rcccc} H(n) & = & HR(n) & + & HJ(n) \\ & & \text{REAL} & & \text{IMAG} \\ G(n) & = & GR(n) & + & GJ(n) \end{array}$$

It is a simple matter to calculate the magnitude for each frequency, HM(n) and GM(n) as in Equations 20 and 21. The magnitude versus frequency for Iss1(n) HM(n) and the magnitude versus frequency for Iss2(n) GM(n) are then searched to find which has the greatest magnitude.

Calculate *magnitude* for each frequency, HM(n) and GM(n), as follows:

$$HM(n) = \sqrt{HR(n)^2 + HJ(n)^2} \qquad \text{Eq. 20}$$

$$GR(n) = \sqrt{GR(n)^2 + GJ(n)^2} \qquad \text{Eq. 21}$$

As set forth above, HM(n) and GM(n) are then searched to find which has the greatest magnitude.

Figure 3A:
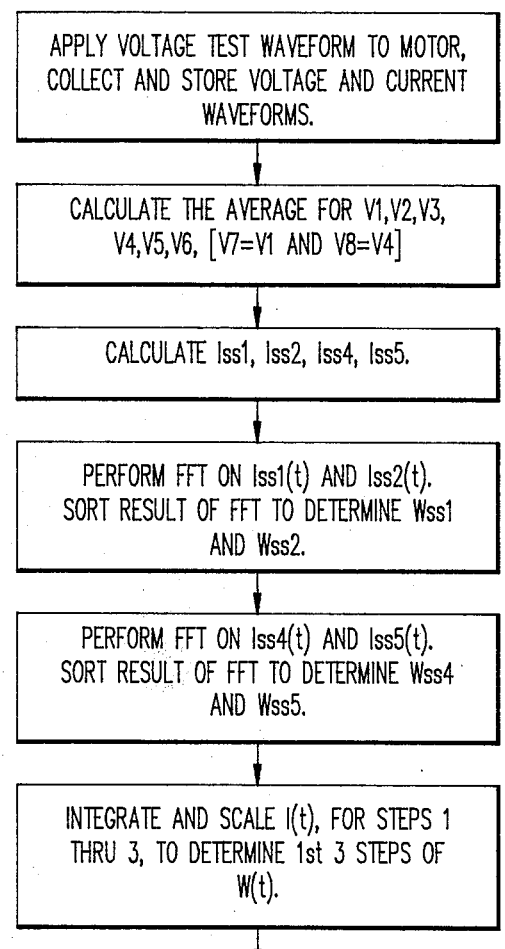

In order to find the least-squares fit such as is involved in Equations 10, 14 and 15, the conventional least-squares fit equation is employed as set forth as Equation 22.

$$\text{SLOPE} = \frac{\Sigma(Xi*Yi) - (\Sigma Xi)(\Sigma Yi)/N}{\Sigma(Xi*Xi) - (\Sigma Xi)(\Sigma Xi)/N} \qquad \text{Eq. 22}$$

where:
SLOPE = SLOPE OF FITTED LINE WHICH IS THE VALUE OF THE PARAMETER BEING SOLVED FOR.
N = NUMBER OF DISCRETE POINTS
Xi = X ARRAY OF DISCRETE POINTS
Yi = Y ARRAY OF DISCRETE POINTS
Σ = SUMMATION OF ALL DISCRETE POINTS With the above in mind, and referring now to the program flowcharts in FIG. 3, and the definitions in Table 7 all of the basic expressions and equations have been defined so that the flowchart is easy to follow and the program may be written directly therefrom. Referring first to FIG. 3A, the first programming step would be to apply the voltage test waveform illustrated in FIG. 2A to the motor, and collect and store the voltage and current waveforms. As illustrated in the flowchart, the average of the voltages V1 through V6, for steps of 1 through 6 respectively, is calculated from the measured points, (the voltage at V7 and V8 will be considered equal respectively to the voltage in Step 1 (FIG. 2A) and Step 4). It is noted that these voltages V1 through V8 correspond to the first step through the eighth step of the voltages illustrated in FIG. 2A. The first, second, fourth and fifth step steady state average current is then calculated, and then a fast Fourier transform is performed on the first and second step steady state current waveforms, as discussed with respect to Equations 16-21. The results of the fast Fourier transform are then sorted to determine the first and second step steady state speeds (Wss1 and Wss2). The same calculation of the fast Fourier transform are employed on the fourth and fifth step steady state average current, Iss4(t) and Iss5(t). Thereafter, the current waveform I(t) is integrated and scaled for the Steps 1-3 (FIG. 2A) to determine the velocity waveform W(t) for the first three steps.

Figure 3B:
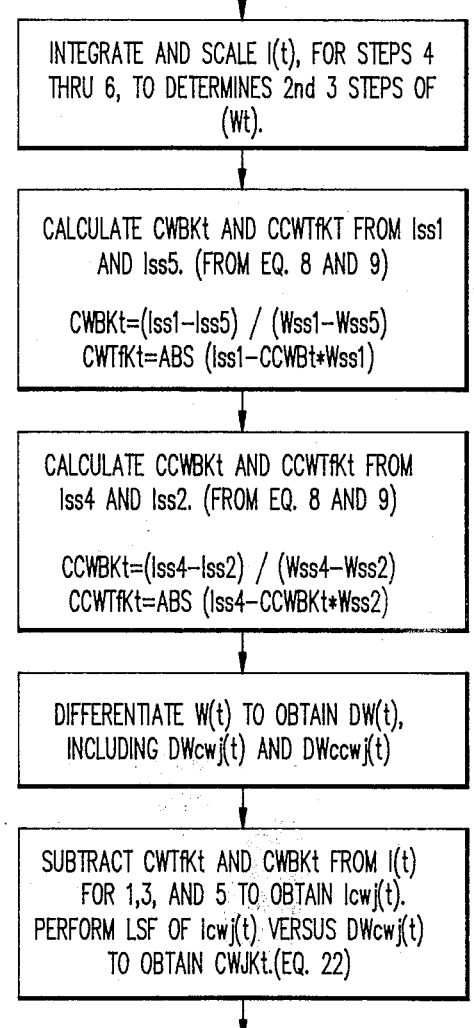

Thereafter, and referring now to FIG. 3B, the current I(t) is integrated and scaled for Steps 4-6 (FIG. 2A) in order to determine the velocity waveform W(t) for the second three steps of FIG. 2A. Thereafter, as from Equations 8 and 9, the clockwise damping friction/torque constant CWBKt and the clockwise constant friction/torque constant CWTfKt is calculated from the first and fifth step steady state average currents Iss1 and Iss5. Thereafter, the counterclockwise damping friction/torque constant and constant friction/torque constant CCWBKt and CCWTfKt respectively are calculated from the second and fourth steps steady state average current.

The velocity waveform W(t) is then differentiated in order to obtain DW(t) including those portions of the velocity derivative from which the torque constant Kt is found. As shown in the last programming step of FIG. 3B, by subtracting the clockwise constant friction/torque constant CWTfKt and the clockwise damping friction/torque constant CWBKt from the current waveform I(t) for voltage Steps 1, 3 and 5 in FIG. 2A, the portion of the current waveform from which CWKJ(t) is found. This portion is referred to as Icwj(t). Thereafter, as best illustrated in Equation 22, a least squares fit is performed on that portion (Icwj(t) versus DWcwj(t)) which is the portion of the velocity derivative from which CWJKt is found. In this manner, CWJKt or the clockwise inertia/torque constant becomes known.

Figure 3C:
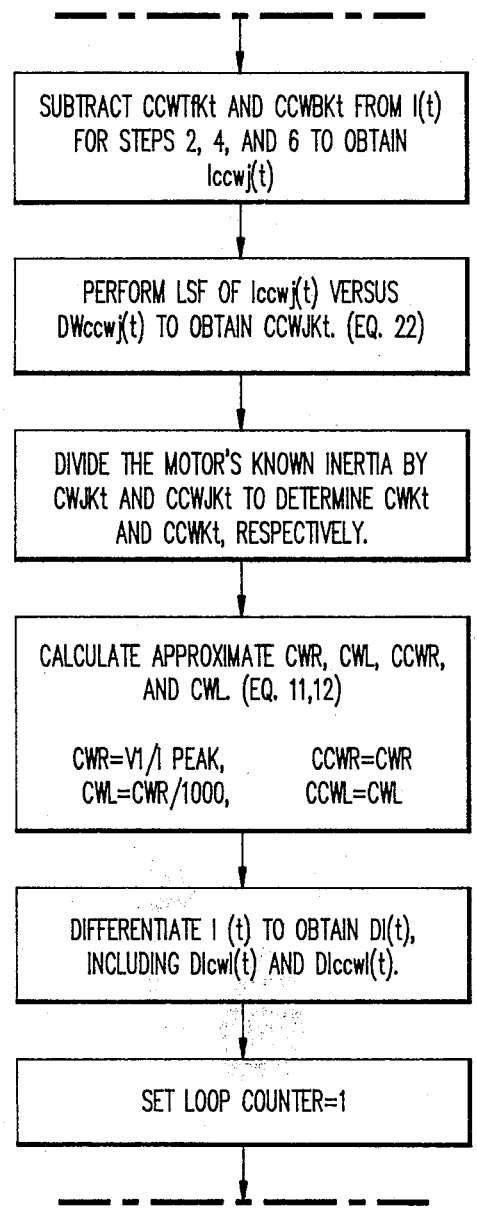

Thereafter, Steps 2, 4 and 6 of the voltage steps as applied in FIG. 2A are exercised as illustrated in FIG. 3C to find the counterclockwise portion of the current waveform from which the counterclockwise inertia/torque constant is found by the least squares fit set forth in Equation 22.

In the next step, the motor's known inertia is divided by the previously found counterclockwise inertia/torque constant and clockwise inertia/torque constant to determine the clockwise torque constant CWBKt and counterclockwise torque constant CCWBKt. Utilizing Equations 11 and 12 from the specification, clockwise resistance, clockwise inductance, counterclockwise resistance and counterclockwise inductance, CWR, CWL, CCWR and CCWL are all calculated. The current waveform is then differentiated to obtain the current derivative waveform DI(t) to obtain both clockwise inductance and counterclockwise inductance, and then a loop counter is set equal to one. As will be shown hereafter, the following steps in the program which are illustrated in FIGS. 3D and 3E respectively, are looped several times (for example 3) to obtain other calculations for determining the important parameters of the motor under test.

Figure 3D:
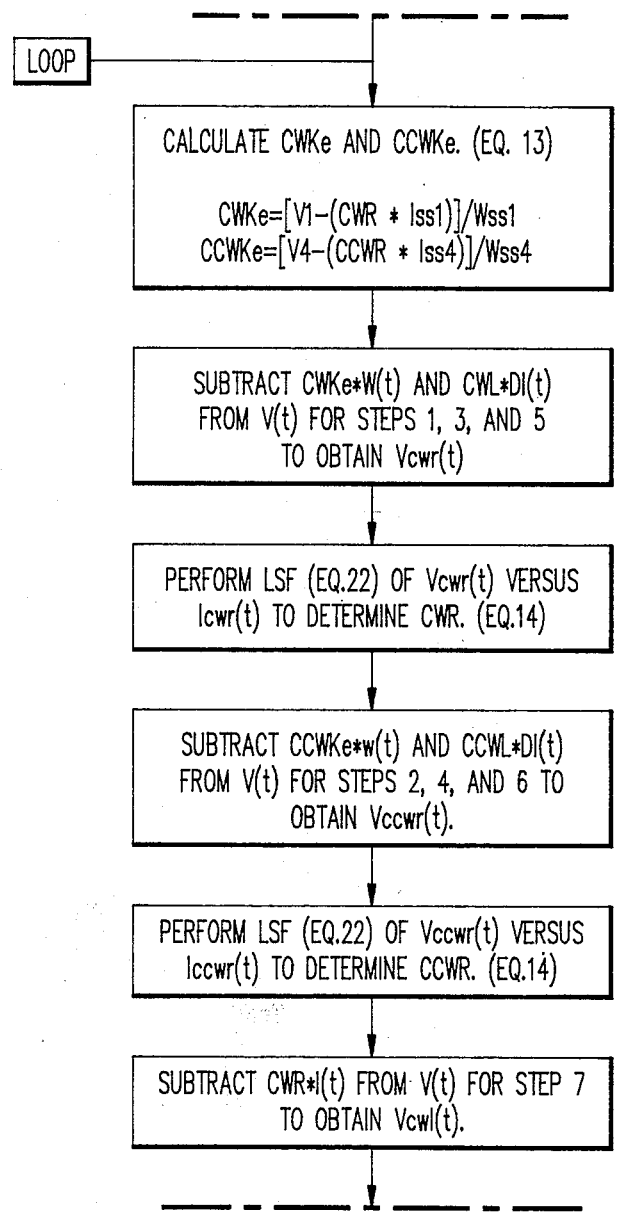

Referring now to FIG. 3D, the calculations shown therein are set forth with respect to Equations 13, 14 and 22 as well as the text material already described for obtaining these parameters. Moreover, as illustrated in FIG. 3E, in those program steps, Equation 22 which sets forth the least squares fit equation, as well as Equation 15 are used to determine a first set of values for the variables employed in the loop of FIGS. 3D through 3E and defined in Table 6.

After a first set of values is discovered, a comparison is made to determine whether or not the loop counter is equal to three, (three has been found to be a reasonable number of times to continue the calculations illustrated in FIGS. 3D and 3E so as to obtain convergence of values with errors that are minimal). When the counter reaches three, the program is ended.

Thus, the tester of the present invention, by first determining the motor's velocity and at what current this occurs, is able to determine the principal and predominant factors or parameters of motor operation so as to allow the user to determine whether or not a particular motor meets the requirement for his particular product line.

Although the invention has been described with a certain degree of particularity, it is understood that the present disclosure has been made only by way of example and that numerous changes in the details of construction, the combination and arrangement of parts, and the method of operation may be made without departing from the spirit and scope of the invention as hereinafter claimed.

What is claimed is:

1. A method for testing a direct current motor based upon current time response comprising the steps of:
generating a voltage test waveform having steady state components at a plurality of levels, one of said levels being in the order of magnitude of a rated voltage of said direct current motor, said voltage test waveform being in both polarities for exercising said motor under test in a plurality of its operating regions, said regions being defined in terms of the polarity of current and velocity of said motor and quadrants, at least one of said quadrants being defined as plus current and clockwise motor shaft rotation;
applying said waveform to drive said direct current motor under test and measuring current into the motor under test as a result of said voltage test waveform;
sampling values of said current measured at a plurality of selected times, and;
performing a Fourier transform on approximate steady-state current of said current measured to determine its power-spectral-density and determining frequency at which maximum power is used to thereby determine velocity of the motor.

2. A method in accordance with claim 1 including the step of defining at least one of said quadrants by a minus current and counterclockwise motor shaft rotation.

3. A method in accordance with claim 1 including the step of determining the operating regions in which at least one motor parameter of a plurality of motor parameters is significant, said motor parameters including back-EMF constant, torque constant, terminal resistance, armature inductance, constant friction, or viscous (damping) friction of said direct current motor under test, and limiting the calculation of said one parameter to samples taken from said predetermined operating regions.

4. A method in accordance with claim 1 wherein said direct current motor includes a commutator, and the method includes the steps of calculating at least some of plurality of motor parameters of said direct current motor based upon many data points so as to minimize the effect of disturbances in the current waveform caused by commutation, said motor parameters including back-EMF constant, torque constant, terminal resistance, armature inductance, constant friction, or viscous (damping) friction of said direct current motor under test.

5. A method in accordance with claim 4 including the step of calculating said motor parameters by using a least squares fit of one waveform versus another to thereby average the commutation disturbances.

6. A method for determining the velocity of a direct current motor having commutation segments, comprising the steps of:
generating a stepped voltage test waveform having stead state components at a plurality of levels, one of said levels being in the order of magnitude of a rated voltage of said direct current motor, said voltage test waveform being in both polarities for exercising said motor under test in a plurality of operating regions, said regions being defined in terms of polarity of the motor's state value, current and velocity;
applying said waveform to power a direct current motor being tested;
measuring current into the motor and sampling values of said current measured at a plurality of selected times, and;
performing a Fourier transform on steady-state current of said current measured to determine its power-spectral-density and determining the frequency of maximum power to said motor,
dividing said frequency of maximum power by an integral multiple of the number of commutation segments of said motor to thereby determine rotational velocity of said motor, and;

calculating, from said sampled current, applied voltage waveform and calculated rotational velocity, a plurality of motor parameters.

7. A method in accordance with claim 6 including the step of exercising said motor under test, during said applying step, in a plurality of its operating regions, said regions being defined in terms of polarity of current and velocity of said motor; and defining said operating regions in terms of quadrants, at least one of said quadrants being defined as plus current and clockwise motor shaft rotation.

8. A method in accordance with claim 7 including the step of determining the operating regions in which at least one selected motor parameter is significant, and limiting the calculation of said parameter to samples taken from said predetermined operating regions.

9. A method in accordance with claim 6 wherein the method includes the steps of calculating motor parameters of said direct current motor based upon many data points so as to minimize the effect of disturbances in the current waveform caused by commutation, said motor parameters including back-EMF constant, torque constant, terminal resistance, armature inductance, constant friction or viscous (damping) friction of said direct current motor under test.

10. A method in accordance with claim 9 including the step of calculating said motor parameter by using a least squares fit of one waveform versus another to thereby average the commutation disturbances.

* * * * *

UNITED STATES PATENT AND TRADEMARK OFFICE
CERTIFICATE OF CORRECTION

PATENT NO. : 4,744,041

DATED : May 10, 1988

INVENTOR(S) : Timothy L. Strunk et al

It is certified that error appears in the above-identified patent and that said Letters Patent is hereby corrected as shown below:

Col. 1, line 8, change "base" to --based--.

Col. 9, line 24, change "EME cannot" to --EMF constant--;

line 58, change "contant" to --constant--.

Col. 16, line 48, change "stead" to --steady--.

Signed and Sealed this

Twentieth Day of September, 1988

Attest:

DONALD J. QUIGG

*Attesting Officer*   *Commissioner of Patents and Trademarks*